US009006595B2

(12) United States Patent
Craig

(10) Patent No.: US 9,006,595 B2
(45) Date of Patent: Apr. 14, 2015

(54) LINK DISCONNECT BOX FOR AN ELECTRICAL DISTRIBUTION NETWORK PROTECTOR

(71) Applicant: Richards Mfg. Co., Irvington, NJ (US)

(72) Inventor: Douglas Robert Craig, Manalapan, NJ (US)

(73) Assignee: Richards Manufacturing Company, Irvington, NJ (US)

( * ) Notice: Subject to any disclaimer, the term of this patent is extended or adjusted under 35 U.S.C. 154(b) by 189 days.

(21) Appl. No.: 13/750,603

(22) Filed: Jan. 25, 2013

(65) Prior Publication Data

US 2013/0288527 A1 Oct. 31, 2013

Related U.S. Application Data

(60) Provisional application No. 61/639,302, filed on Apr. 27, 2012, provisional application No. 61/638,830, filed on Apr. 26, 2012.

(51) Int. Cl.

| H01H 1/64 | (2006.01) |
|---|---|
| H05K 5/00 | (2006.01) |
| H05K 13/00 | (2006.01) |
| H02B 1/20 | (2006.01) |
| H02B 1/46 | (2006.01) |
| H01H 31/16 | (2006.01) |
| H02B 1/28 | (2006.01) |
| H01H 31/06 | (2006.01) |

(52) U.S. Cl.
CPC .............. *H05K 5/0065* (2013.01); *H05K 13/00* (2013.01); *Y10T 29/49117* (2015.01); *H02B 1/20* (2013.01); *H02B 1/28* (2013.01); *H02B 1/46* (2013.01); *H01H 31/06* (2013.01); *H01H 31/16* (2013.01)

(58) Field of Classification Search
CPC ....... H01H 31/00; H01H 31/06; H01H 31/16; H01H 31/26; H02B 1/20; H02B 1/28; H02B 1/46
USPC ................ 200/293, 243, 244, 50.1, 296, 297; 439/507, 511, 911
See application file for complete search history.

(56) References Cited

U.S. PATENT DOCUMENTS

| 2,020,913 | A | * | 11/1935 | Schramm ...................... 361/634 |
| 3,742,410 | A | * | 6/1973 | Smith ............................. 336/65 |
| 3,983,460 | A | | 9/1976 | Kuhn et al. |
| 4,269,471 | A | * | 5/1981 | Woertz ............................. 439/94 |

(Continued)

OTHER PUBLICATIONS

Office Action issued on Oct. 24, 2014 in Canadian Patent Application No. 2814107.

*Primary Examiner* — Kyung Lee
(74) *Attorney, Agent, or Firm* — Stroock & Stroock & Lavan LLP

(57) ABSTRACT

A link disconnect box enables easy field retrofitting of network protectors. The link disconnect box has an outer casing that defines a cavity with a front face opening and top and bottom bus bar openings. Top and bottom terminals seal the top and bottom bus bar openings. The bottom terminal is configured to connect to an existing terminal of the network protector. A removable face plate seals shut the front face opening. Top and bottom bus bars electrically connect to the top and bottom terminals, extending through the respective top and bottom bus bar openings towards each other, with an air gap between them within the cavity. An electrical link, which can be bolted closed, connects and disconnects the top and bottom bus bars by electrically bridging the air gap.

32 Claims, 16 Drawing Sheets

(56) References Cited

U.S. PATENT DOCUMENTS

| | | | |
|---|---|---|---|
| 5,597,991 A * | 1/1997 | Chen et al. | 200/50.02 |
| 5,820,413 A * | 10/1998 | Yamada et al. | 439/620.26 |
| 5,829,995 A * | 11/1998 | Rischard et al. | 439/212 |
| 5,876,224 A * | 3/1999 | Chadbourne | 439/110 |
| 7,108,943 B2 * | 9/2006 | Yamakawa et al. | 429/180 |

* cited by examiner

LINK DISCONNECT BOX FOR AN ELECTRICAL DISTRIBUTION NETWORK PROTECTOR

CROSS-REFERENCE TO RELATED APPLICATIONS

This application claims the benefit of U.S. Provisional Application No. 61/638,830, filed Apr. 26, 2012, and of U.S. Provisional Application No. 61/639,302, filed Apr. 27, 2012. The contents of both of these applications are incorporated herein by reference.

BACKGROUND OF THE INVENTION

1. Field of the Invention

The present invention generally relates to electrical power distribution systems. In particular, the present invention relates to a link disconnect box that allows for the easy isolation of a network protector switch from load side connections.

2. Description of the Related Art

The distribution of electricity in urban centers involves medium voltage (up to 35 kV) electrical cables (called "feeders") connecting a power substation to the utility customer base. In the vicinity of the customer, connections are made from the feeder to a transformer that reduces the voltage to one capable of being utilized by the customer. In order to sectionalize the feeder, that is, to isolate the feeder in the event of an electrical fault, three phase power breakers called network protectors are installed on the low voltage side of the transformer. The customer connection side ("load side") of various network protectors can be shorted together to create a low voltage electrical grid ("network"), which provides reliable power service to the utility customer. Secondary power lines extend from the low voltage electrical grid to the consumers, and as a result a failure of any single transformer in the grid does not disrupt power to the consumers.

There are presently tens of thousands of these network protectors in operation in urban electrical centers throughout the world. Each network protector operates as an automatic switch, connecting or disconnecting the related transformer to the network based upon the monitoring of electrical conditions. A network protector comprises a large three phase switch/breaker element installed in an enclosure, which can be a submersible tank or a non-submersible cabinet. The switch element is connected on one side to the low voltage side of a transformer and on the other side to the network. Because the load side of the network protector can be connected to the load side of other network protectors in a network system, there is an enormous amount of electrical energy available at any one network protector. Protecting utility workers from this energy while they are servicing network protectors is of paramount importance.

As indicated above, the network protector acts as a three-phase switch between the low-voltage side of a transformer and the customer. When a transformer, network protector or both need to be serviced, the feeder to the transformer can be isolated so as to prevent high voltage current from reaching the transformer using an electrical switch between the feeder and the transformer. However, because of the networked connections on the low voltage side of the network protector, it is not possible to isolate the network protector itself from low voltage current. Consequently, the customer side of the network protector remains energized, and this can present serious safety issues for linemen, particularly in the form of arc flash when servicing the network protector.

It is therefore desirable to provide a link disconnect box that can be retrofitted onto the existing terminals of a network protector so that, once installed, linemen can readily disconnect a network protector from a low voltage network.

SUMMARY OF THE INVENTION

In one aspect, a link disconnect box for a voltage distribution network is disclosed. The link disconnect box has an outer casing that define a cavity, a front face opening, a top bus bar opening, and a bottom bus bar opening. A top terminal is disposed over the top bus bar opening, while a bottom terminal is disposed over the bottom bus bar opening. The bottom terminal is configured to electrically and mechanically connect to an existing terminal of a network protector in the voltage distribution network. A face plate removably covers the front face opening. A top bus bar electrically couples to the top terminal and extends through the top bus bar opening, and a bottom bus bar electrically couples to the bottom terminal and extends through the bottom bus bar opening. An air gap electrically isolates the top bus bar from the bottom bus bar within the cavity. An electrical link connects and disconnects the top bus bar and the bottom bus bar by electrically bridging the air gap.

In a preferred embodiment, the face plate sealingly covers the front face opening, the top terminal sealingly covers the top bus bar opening, and the bottom terminal sealingly covers the bottom bus bar opening. In such embodiments, the face plate may further include an air pressurization port for pressurizing the cavity.

In one embodiment the bottom terminal comprises through holes configured to align with connectors, such as bolts or threaded holes, in the existing terminal of the network protector. In preferred embodiments, however, the bottom terminal has threaded openings that do not pass through the bottom terminal.

In various embodiments the bottom terminal comprises a bottom terminal plate covering the bottom bus bar opening and mechanically coupled to the bottom bus bar, and a terminal adapter plate removably connected to the bottom terminal plate. The terminal adapter plate has a first surface configured to mechanically and electrically engage with the bottom plate terminal, and a second surface configured to mechanically and electrically engage with the existing terminal of the network protector. Preferably, the bottom terminal plate has a larger surface area than the existing terminal of the network protector. In such embodiments the terminal adapter plate may have first through holes for coupling the terminal adapter plate to the bottom terminal plate, and second through holes for coupling the terminal adapter plate to the existing terminal of the network protector, in which the first through holes delimit a greater surface area than a surface area delimited by the second through holes. It may also be preferable that the bottom terminal plate has threaded openings that do not pass through the bottom terminal plate, with the first through holes aligning with the threaded openings.

In various embodiments the electrical link is configured to be mechanically secured in a closed position in which the air gap is bridged, and is further configured to fall under gravity into an open position in which the air gap is not bridged when not mechanically secured in the closed position. For example, the electrical link may include a swing arm for bridging the air gap, the swing arm having at least an opening, with the upper bus bar having a hole corresponding to the opening in the swing arm. A bolt can then be run through the opening in the swing arm and engage with the threaded hole in the upper bus bar to mechanically secure the link in the closed position.

In some embodiments the top terminal may have a mechanical configuration corresponding to the existing terminal of the network protector, so that secondary power lines can be readily moved from the existing terminal of the network protector to the top terminal. In other embodiments the top terminal is a spade terminal. In yet other embodiments the bottom terminal is a spade terminal.

In another aspect, a method for the field retrofitting of a network protector in a voltage distribution network is disclosed. Secondary power lines from an existing output terminal of the network protector are removed. A link disconnect box is electrically and mechanically coupled to the existing terminal of the network protector, with the secondary power lines electrically and mechanically coupled to the link disconnect box. The link disconnect box may have the structure described above, with the bottom terminal of the link disconnect box connecting to the existing terminal of the network protector, and the top terminal of the link disconnect box being used to connect to secondary power lines.

BRIEF DESCRIPTION OF THE DRAWINGS

The various aspects and embodiments disclosed herein will be better understood when read in conjunction with the appended drawings, wherein like reference numerals refer to like components. For the purposes of illustrating aspects of the present application, there are shown in the drawings certain preferred embodiments. It should be understood, however, that the application is not limited to the precise arrangement, structures, features, embodiments, aspects, and devices shown, and the arrangements, structures, features, embodiments, aspects and devices shown may be used singularly or in combination with other arrangements, structures, features, embodiments, aspects and devices. The drawings are not necessarily drawn to scale and are not in any way intended to limit the scope of this invention, but are merely presented to clarify illustrated embodiments of the invention. In these drawings.

DETAILED DESCRIPTION OF THE PREFERRED EMBODIMENTS

Figure 1:
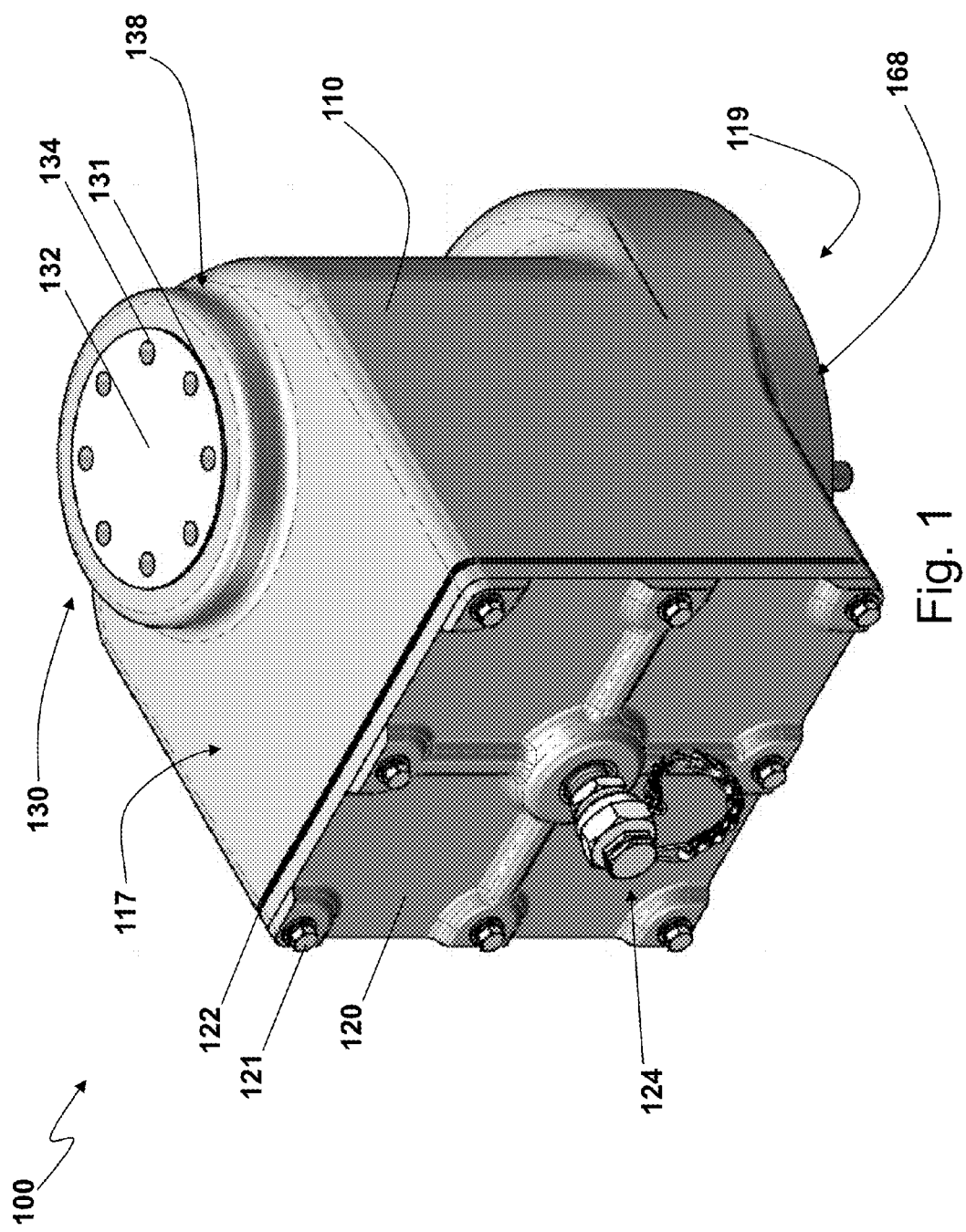
FIG. 1 is a perspective view of an embodiment link disconnect box.
Figure 2:
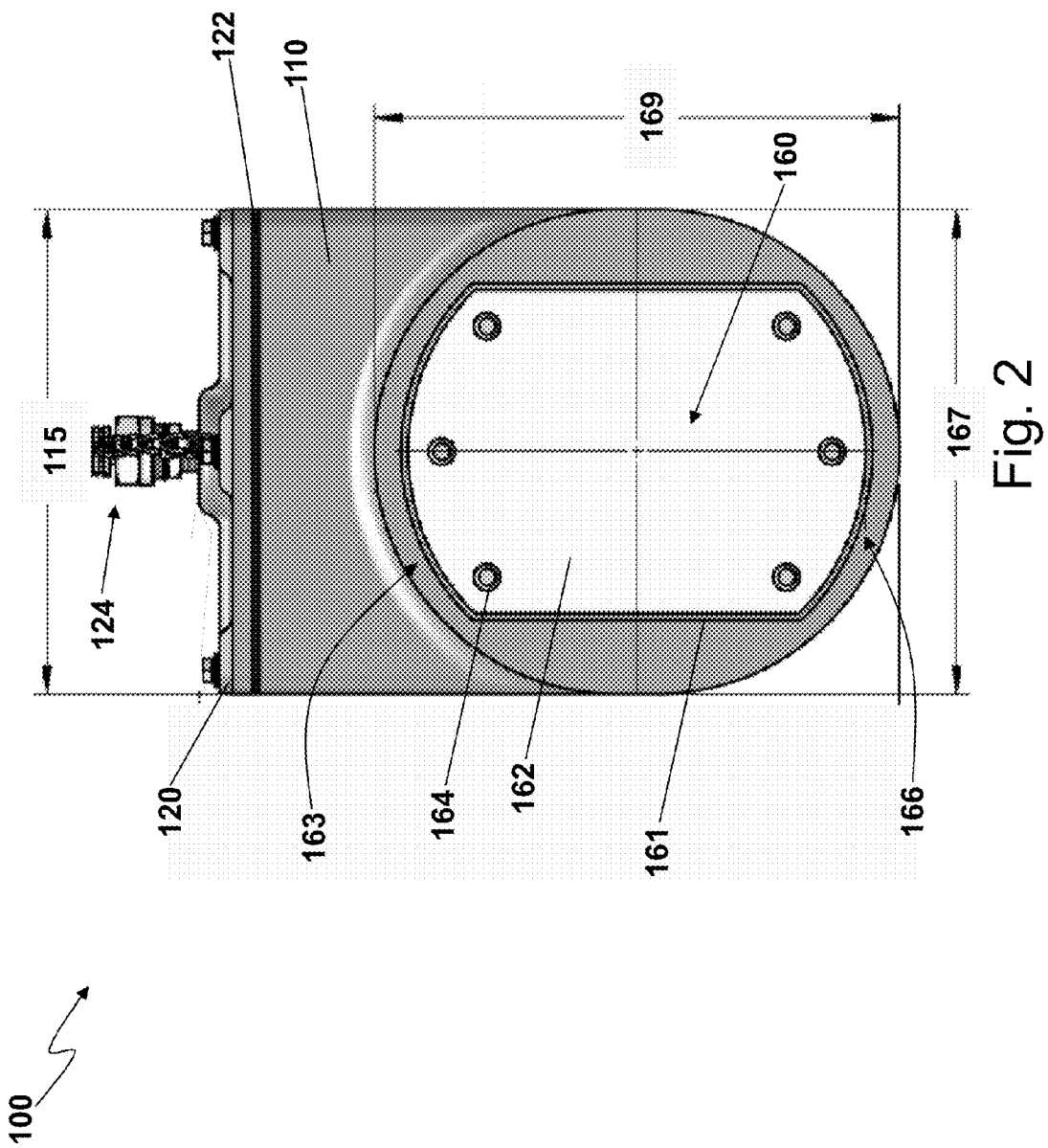
FIG. 2 is a bottom view of the link disconnect box shown in FIG. 1.
Figure 3:
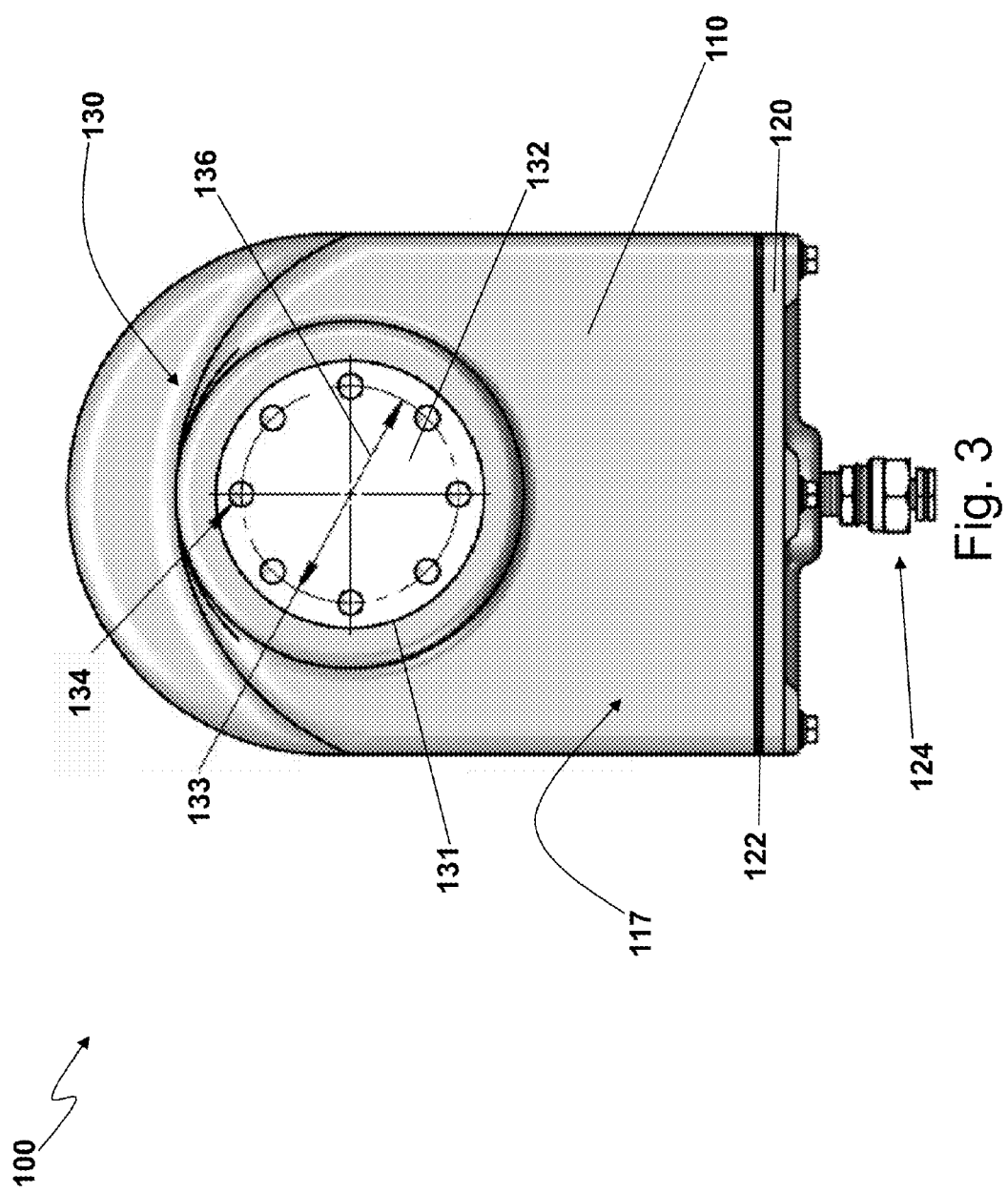
FIG. 3 is a top view of the link disconnect box shown in FIG. 1.
Figure 4:
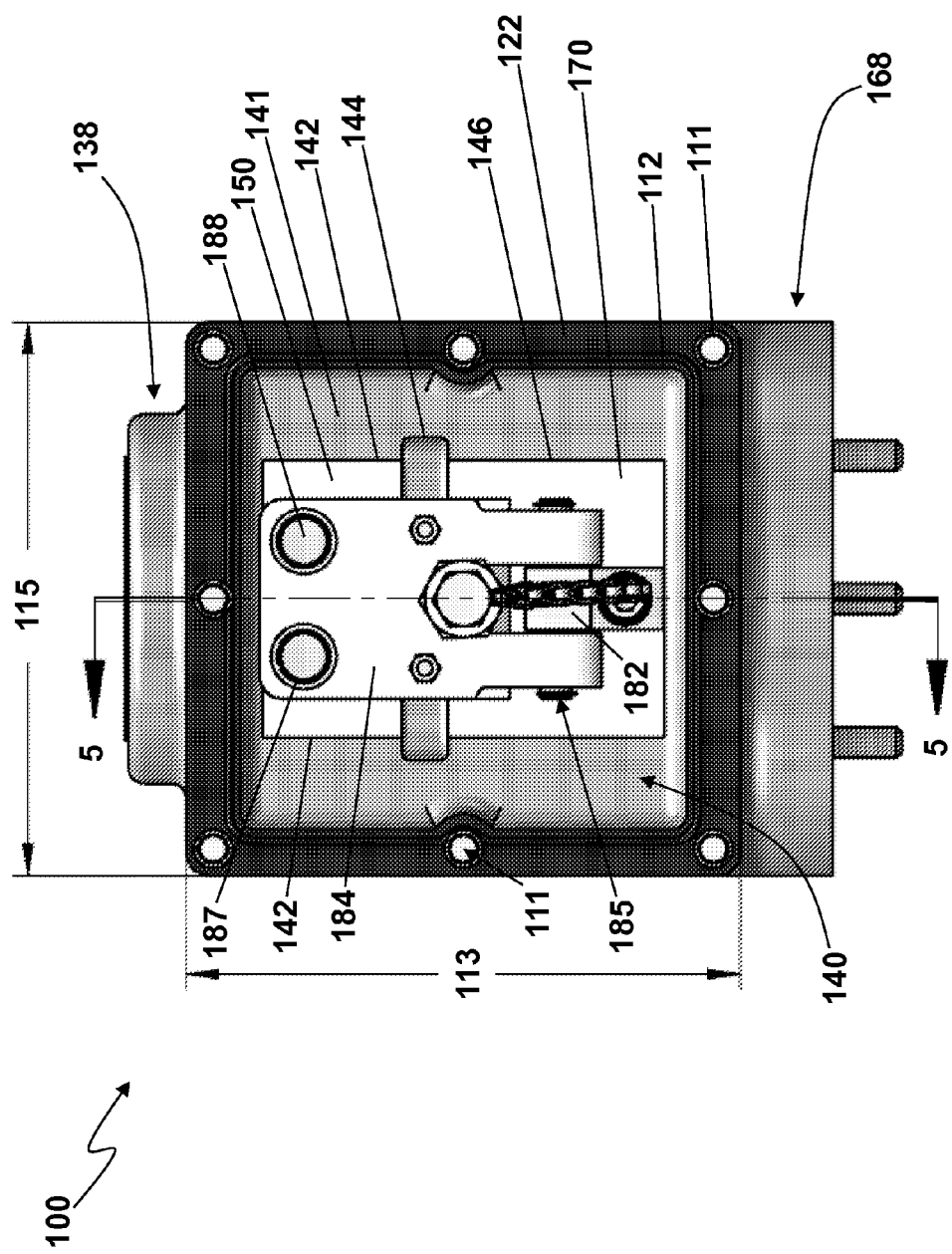
FIG. 4 is a front x-ray view of the link disconnect box shown in FIG. 1.
Figure 5:
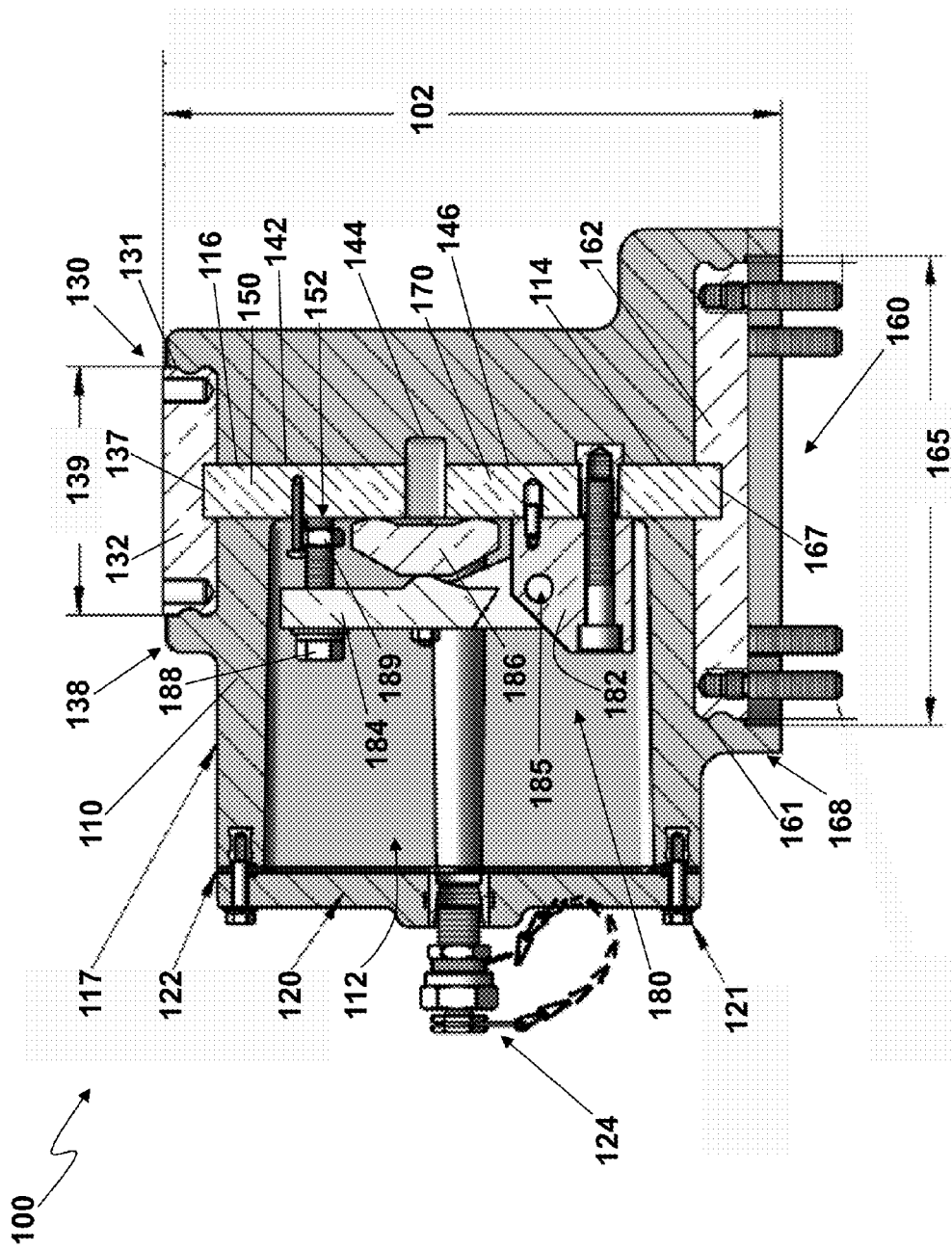
FIG. 5 is a cross-sectional view along a line 5-5 shown in FIG. 4.

Various embodiments of the invention provide a link disconnect box that can be field installed, for example, on top of the existing terminals of a network protector and that allows for the easy isolation of the network protector from the load side connections. Various embodiments of a link disconnect box may include a submersible box with one or more bolted links. When unbolted, the links fall and thereby isolate each phase of the network protector. The links may be unbolted using an extended insulated wrench to add distance between the worker and the electrical energy. The link disconnect box can be configured for mounting, for example, on existing spade or stud type terminals that are commonly used with network protectors. The link disconnect box may also be wall mounted. The link disconnect box can advantageously be mounted on network protectors already operating in the field, thus allowing a utility to gain a measure of protection for its workers without replacing equipment. Terminal adapters may be used to conform the terminals of the link disconnect box with the existing terminals of the network protector and with the secondary power lines that form the low voltage network.

Reference is initially drawn to FIGS. 1-5, which illustrate a first embodiment link disconnect box 100 that may be field-installed on a conventional network protector, and in particular on existing electric terminals of a network protector. Link disconnect box 100 includes an outer casing 110 that defines an internal cavity 140, which is preferably a monolithic, molded structure made from any suitably durable and electrically insulating material, such as polyester glass, or epoxy, and having a front face opening 112, a bottom bus bar opening 114 and a top bus bar opening 116. A face plate 120 is used to cover the front face opening 112, with a gasket 122, such as made from rubber, interposed between the face plate 120 and the rim of front face opening 112 to ensure that the front face plate 120 makes a liquid-tight seal with the outer casing 110. The face plate 120 may be made from the same material as that used for the outer casing 110, or from any other suitable, electrically insulating material. Bolts 121 are used to secure front face plate 120 to the outer casing 110, the bolts 121 engaging with corresponding threaded openings 111 set in the rim of front face opening 112. Brass inserts or the like may be used to provide the corresponding threading within the openings 111. To reduce the chances of ingress of liquids into cavity 140, preferably the only openings in outer casing 110 are front face opening 112, bottom bus bar opening 114 and top bus bar opening 116.

The rim of front face opening 112 may be substantially square having, for example, a height 113 and a width 115 of 9 inches. Of course, other dimensions for the width 115 and height 113 are possible, but dimensions are preferred that provide sufficient access room for a lineman while remaining sufficiently small to ensure adequate spacing of the boxes 100 when mounted on a network protector. Hence, preferred embodiment widths 115 may be from 7 to 10 inches, and heights 113 may be from 7 to 12 inches.

A top surface 117 of the outer casing 110 is formed so as to provide a recess 131 for a top terminal 130. Recess 131, which may be substantially circular, surrounds top bus bar opening 116. Top terminal plate 132, which may be made from copper, optionally plated with silver or tin, is disposed within recess 131. Preferably, universal top terminal plate 132 forms a liquid-tight seal with outer casing 110. In certain preferred embodiments, the outer casing 110 is molded around universal top terminal plate 132 to ensure such a liquid-tight seal. Top terminal plate 132 is preferably shaped to be compatible with existing infrastructure, and in particular with standard connections used for the low voltage grid of an electrical power distribution system, such as spade terminals or the like. In a preferred embodiment, top terminal plate 132 has eight threaded holes 134 equidistantly aligned along a circle 133 having a diameter 136 of 3 and ¾ inches. Holes 134 preferably do not pass all the way through top terminal plate 132. Threaded holes 134 are preferably sized to engage with ½ inch bolts. Recess 131 itself may therefore have a diameter 139 of, for example, 4 and ⅝ inches, with top terminal plate 132 then sized to fit snugly within, or be molded within, recess 131. Top terminal plate 132 may have a thickness of about 1 inch.

A back surface 141 of the cavity 140 defined by outer casing 110 is shaped to have a top recess 142 aligned with top bus bar opening 116, and within which is disposed a top bus bar 150 that extends through top bus bar opening 116 to physically and electrically contact top terminal plate 132. Top bus bar 150 preferably makes a liquid-tight seal with top bus bar opening 116. Although the term "bus bar" is used, it should be understood that here and in the following such electrical components are not limited to bar-like shapes, and that other shapes are possible, including tubes, rods or any other suitable shape. Hence, it should be understood that the term "bus bar" includes any suitable shape that is capable of carrying the currents intended for the link disconnect box. Top bus bar 150 may be, for example, brazed to the top terminal plate 132. Top terminal plate 132 may include a recess 137 within which top bus bar 150 may be disposed to provide greater contact surface area between the electrical bus components 132, 150. Top bus bar 150 may be made from silver-plated copper, for example, and have a thickness of ⅝ of an inch to 2 inches, preferably about 1 inch, and a width of 3 to 4 inches. The depth of top recess 142 may be such that the top bus bar 150 lies flush with the back surface 141 when disposed within the recess 142. Top bus bar 150 also preferably includes one or more threaded holes 152, which are discussed below.

In a similar vein, a bottom surface 119 of outer casing 110 is formed so as to provide a recess 161 for a bottom terminal 160. Recess 161, which may be substantially rectangular but with semi-circular ends, surrounds bottom bus bar opening 114. Note that both recess 131 on top surface 117 and recess 161 on bottom surface 119 may be set within respective protrusions 138, 168, such as circular or elliptical protrusions, extending from top surface 117 and bottom surface 119, respectively, of outer casing 110, as indicated in the figures for this specific embodiment. These protrusions 138, 168 may give the outer casing 110 a total height 102 of, for example, about 12 inches. This is not, however, a requirement of the invention. However, such protrusions 138, 168 do provide the benefit of providing a standoff distance from the surface of the network protector upon which link disconnect box 100 is mounted, which may make for easier installation of link disconnect box 100 onto the existing terminals of a network protector.

Bottom terminal plate 162, which may be made from silver-plated copper, is disposed within recess 161 of protrusion 168 of outer casing 110. Preferably, bottom terminal plate 162 is sealed within the recess 161 so as to provide a liquid-tight seal between bottom terminal plate 162 and outer casing 110. By way of example, an adhesion promoter may be used so that the polyester glass bonds to the copper when molded. Bottom terminal plate 162 may be shaped to be compatible with existing infrastructure, and in particular with standard connections used for network protectors or shaped to properly mate with a specific make and/or model of network protector. In a preferred embodiment, bottom terminal plate 162 has six threaded holes 164, three of which are equidistantly spaced along a first semi-circular end 163 of the bottom terminal plate 162, and three of which are equidistantly spaced along an opposing second semi-circular end 166 of bottom terminal plate 162. The threaded holes 164 are preferably sized to engage with ½ inch bolts. Protrusion 168 within which recess 161 is set may be elliptical, having a major axis 169 of, for example, 9 and ¾ inches, and a minor axis 167 of 9 inches. Bottom terminal plate 162 may have a thickness of about 1 inch, and a length 165 of about 8 and ¾ inches.

The back surface 141 of cavity 140 is further shaped to have a bottom recess 146 aligned with bottom bus bar opening 114, and within which is disposed a bottom bus bar 170 that extends through bottom bus bar opening 114 to physically and electrically contact bottom terminal plate 162. Bottom terminal plate 162 may include a recess 167 within which bottom bus bar 170 may be disposed to provide greater contact surface area between the components 162, 170. Bottom bus bar 170 may be made from silver-plated copper, for example, and have a thickness of from ⅝ of an inch to 2 inches, preferably 1 inch, and a width of 3 to 4 inches, similar to that of top bus bar 150. The depth of bottom recess 146 may be such that bottom bus bar 170 lies flush with the back surface 141 when disposed within the recess 146.

Top bus bar 150 extends down from top terminal plate 132, through top bus bar opening 116 and to a top edge of a central recess 144 in back surface 141. Similarly, bottom bus bar 170 extends up from bottom terminal plate 162, through bottom bus bar opening 114 and to the bottom edge of central recess 144. Central recess 144 is located within a central region of back surface 141, and has a depth and width that preferably exceeds those of top recess 142 and bottom recess 146. Central recess 144 provides a suitable air gap between top bus bar 150 and bottom bus bar 170 to electrically isolate top bus bar 150 from bottom bus bar 170.

In one embodiment, top terminal plate 132 is first braised to top bus bar 150, bottom terminal plate 162 is braised to bottom bus bar 170, and then these components are set into a suitable mold so that molding material forming outer casing 110 is molded around top terminal plate 132, top bus bar 150, bottom terminal plate 162 and bottom bus bar 170, thereby ensuring that these components are held firmly into position in a liquid- and air-tight manner.

An electrical link 180 is used to selectively electrically connect and disconnect top bus bar 150 and bottom bus bar 170 by electrically bridging air gap 144 existing between bus bars 150 and 170. When electrically disconnecting top bus bar 150 from bottom bus bar 170, link 180 with central recess 144 together ensure that an adequate air gap exists between these components 150 and 170. Link 180 includes a base 182 that is firmly affixed, such as bolted, to bottom bus bar 170, back surface 141 or both, and which is made from, for example, brass. A swing arm 184 is pivotally connected to base 182, which may also be made from, for example, brass. Swing arm 184 is pivoted so as to swing up and down along the vertical direction as defined by bus bars 150 and 170, with a pivot point 185 of swing arm 184 being at the lower end of swing arm 184. When swung into the up, closed, position, swing arm 184 is substantially parallel to bus bars 150 and 170; when swung into the down, open, position, swing arm 184 is substantially perpendicular to bus bars 150, 170 and points towards front face opening 112. A bus bar bridge 186 is fixedly connected, such as bolted, to the surface of swing arm 184 that faces bus bars 150 and 170 and at a position that is above pivot point 185. Bus bar bridge 186 may be made, for example, from silver-plated copper and have a thickness from ⅝ of an inch to 1 inch, and preferably of about 1 inch. When link 180 is in the closed position, upper and lower ends of bus bar bridge 186 respectively contact upper bus bar 150 and lower bus bar 170 to electrically connect bus bars 150 and 170 together. Also, when in the closed position, one or more openings 187 in swing arm 184 align with one or more threaded holes 152 in upper bus bar 150, so that one or more respective bolts 188 may run through openings 187 to threadedly engage with threaded holes 152 so as to bolt link 180 into the closed position. Nuts 189 may be disposed on each bolt 188 between swing arm 184 and top bus bar 150 to prevent bolts 188 from falling out of openings 187 when link 180 is in the open position. An electrical pathway provided by bottom terminal plate 162, bottom bus bar 170, bus bar bridge 186, top bus bar 150 and top terminal plate 132 is designed to safely support the maximum electrical power load needed from the respective phase output port of the network protector. For example, the electrical pathway may be constructed so as to support current ranges from 800 Amperes to 5100 Amperes.

In use, face plate 120 may be unbolted from outer casing 110 so that a lineman can gain access to link 180. Then, using an extended insulated wrench, the lineman can unscrew the one or more bolts 188 so that they disengage from threaded holes 152. Swing arm 184 then swings down, opening link 180 and thus de-energizing one phase of the network protector from the low voltage network. Further, as pivot point 185 of swing arm 184 is positioned to be well below the center of mass of swing arm 184, swing arm 184 will naturally tend to swing down into the open position and remain there, ensuring a naturally open position of link 180 to ensure the safety of the lineman. Once servicing of the network protector, transformer or both has been completed, link 180 may be once more bolted into the closed position by way of bolt(s) 188 and face plate 120 put back into place, thereby sealing shut cavity 140.

In some embodiments, face plate 120 may include an air pressurization port 124, of any suitable known design, that can be releasably connected to a pressurized air source to pressurize cavity 140 so as to further prevent ingress of any liquids into cavity 140. Air pressurization port 124 may be any suitable one-way valve or the like, as known in the art, such as a ball valve, needle valve or the like, and may optionally be threaded.

Figure 6:
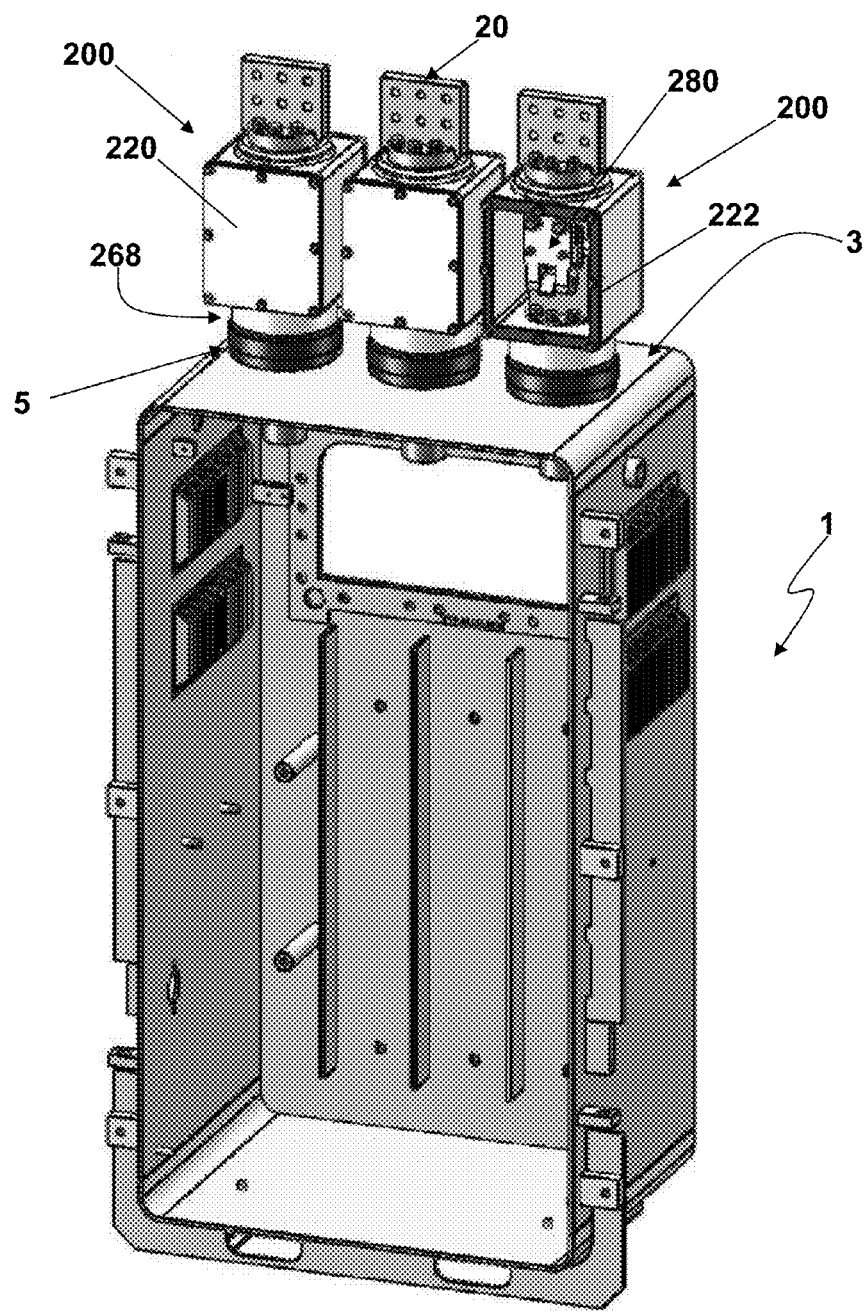
FIG. 6 is a perspective view of embodiment link disconnect boxes coupled to a network protector.

FIG. 6 illustrates a network protector 1 employing alternate embodiment link disconnect boxes 200. Each link disconnect box 200 is substantially similar to link disconnect box 100 discussed above, but does not include the air pressurization port 124 and has a slightly modified bottom terminal plate 262 for bottom terminal 260. Three link disconnect boxes 200 are installed on the top surface 3 of network protector 1, one for each of the three phases output by network protector 1 on respective output terminals 5. That is, network protector 1 has three existing output terminals 5 respectively for the three-phase power provided over the low voltage network. The protrusion 268 and related bottom terminal 260 of each link disconnect box 200 is installed onto a respective existing output terminal 5 of network protector 1. As shown in FIG. 6, when the face plate 220 is removed, a lineman can gain access to the link 280 within each link disconnect box 200 to electrically connect and disconnect the respective terminal 5 of network protector 1 from the low voltage network.

Figure 7:
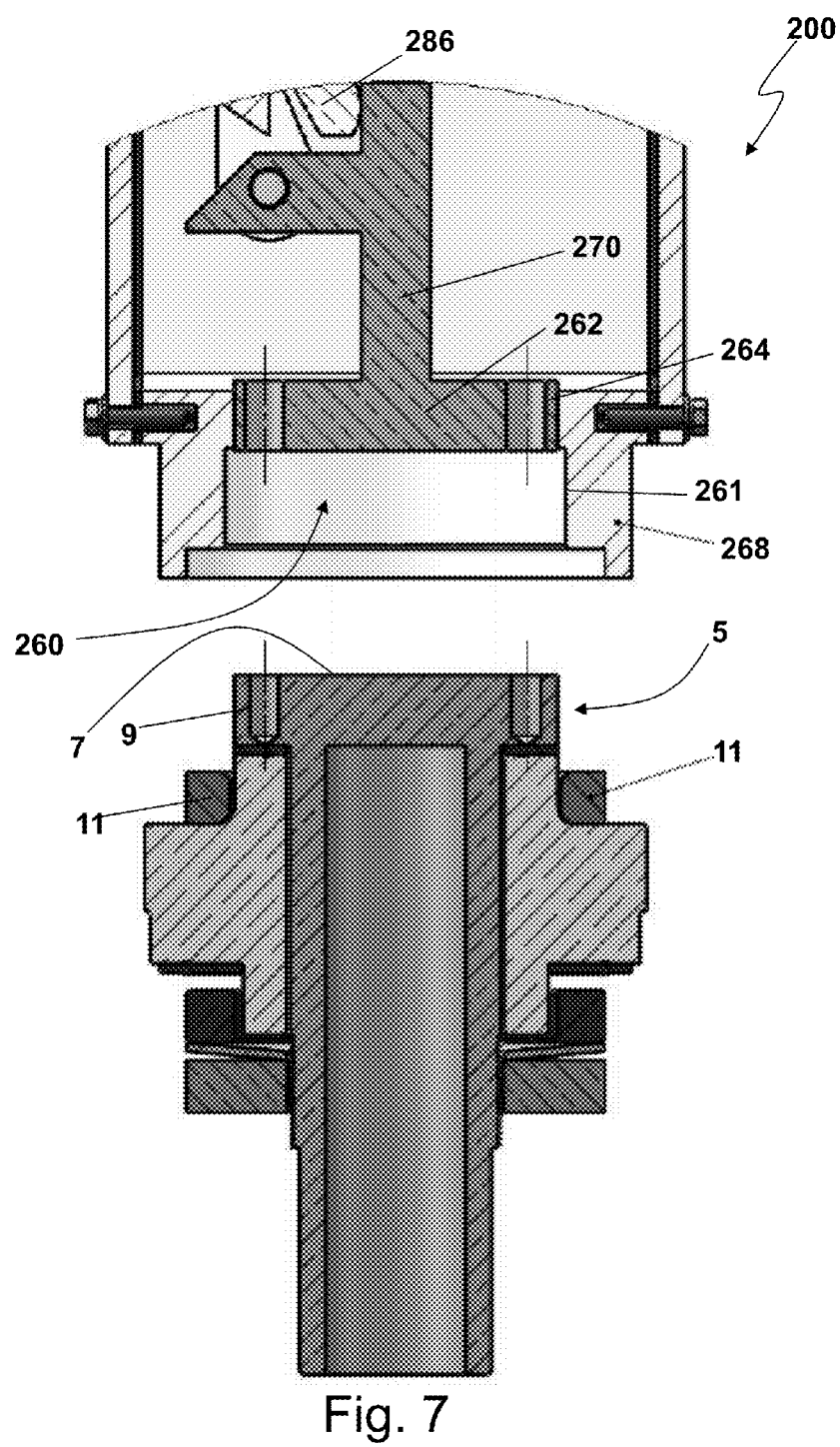
FIGS. 7 and 8 are a detailed cross-sectional views illustrating installation of another embodiment link disconnect box being retrofitted onto a network protector.
Figure 8:
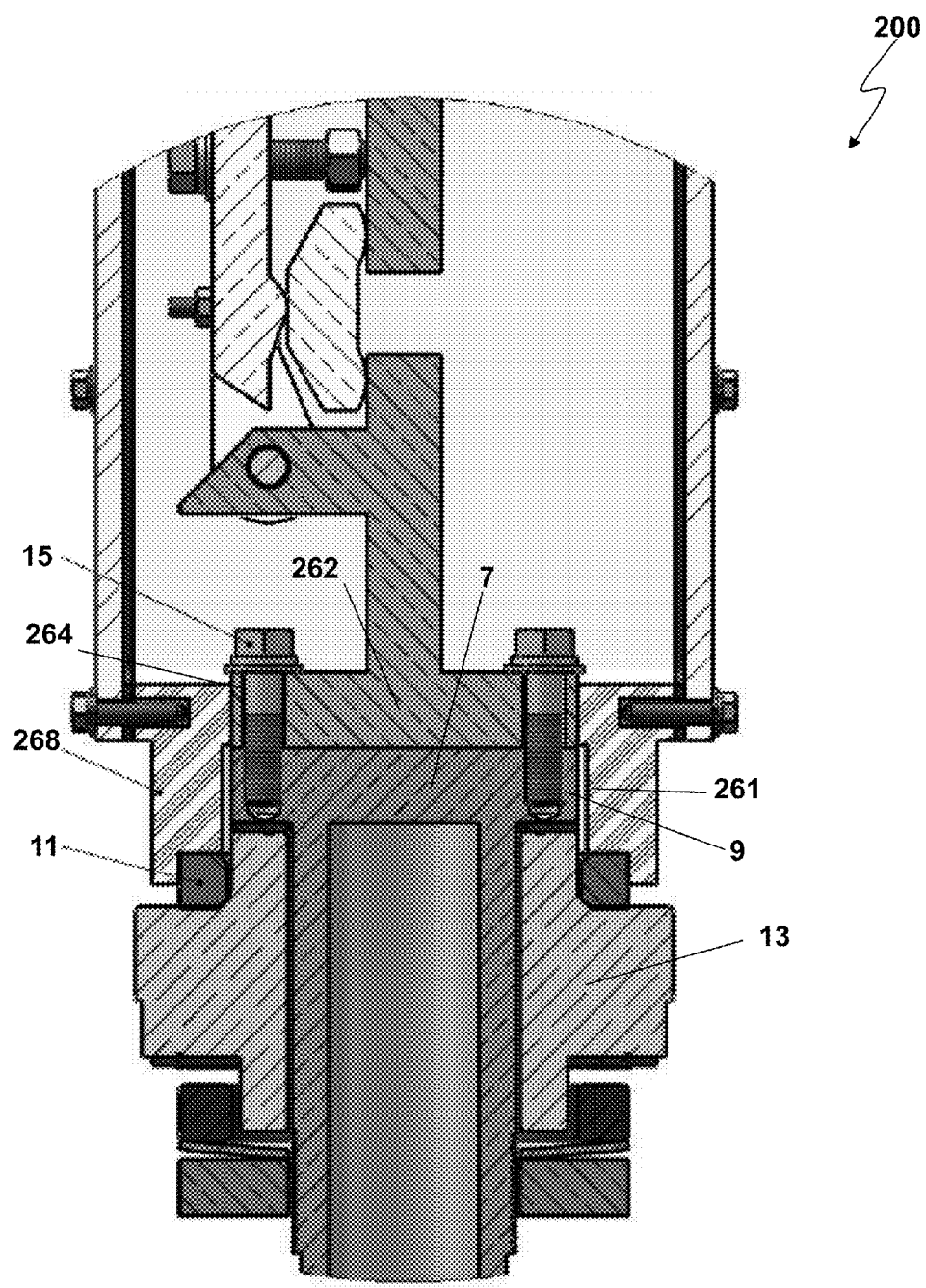

FIGS. 7 and 8 provide detailed views of connecting the link disconnect box 200 to a respective existing terminal 5 of the network protector 1. A benefit of the design of various embodiment link disconnect boxes is that they can be readily retrofitted onto the existing terminals of any network protector 1 in the field, without any need to change or replace the existing terminal 5 of network protector 1. Output terminal 5 of network protector 1 typically includes a top terminal plate 7 that has threaded holes 9 on an upper surface thereof and is used for the connection of secondary power lines for the low voltage network. The exact configuration of top terminal plate 7 may vary from manufacturer to manufacturer of network protectors 1. Bottom protrusion 268 of link disconnect box 200 is shaped to accept existing top terminal plate 7 of network protector 1. More specifically, the recess 261, within which is disposed the bottom terminal plate 262 of link disconnect box 200, is shaped to accept and engage with existing terminal 5 of network protector 1. As shown in FIGS. 7 and 8, upper terminal plate 7 of network protector 1 fits snugly, and is entirely disposed within, recess 261 of link disconnect box 200 to abut against bottom terminal plate 262. Holes 264 in bottom terminal plate 262 are designed to align with threaded holes 9 of top terminal plate 7, and the terminal plates 7 and 262 rest snugly in direct physical contact with each other, as shown in FIG. 8. A rubber O-ring or gasket 11 may be disposed between the rim of recess 261 as provided by bottom protrusion 268 and the housing 13 of the terminal 5 so as to ensure a liquid-tight seal between link disconnect box 200 and network protector 1. Bolts 15 are then disposed through each of the holes 264 in bottom terminal plate 262 to engage with threaded holes 9 in top terminal plate 7 of network protector 1, thereby firmly mechanically and electrically coupling the terminal plates 262 and 7 together, and thus mechanically and electrically coupling link disconnect box 200 to network protector 1.

Figure 9:
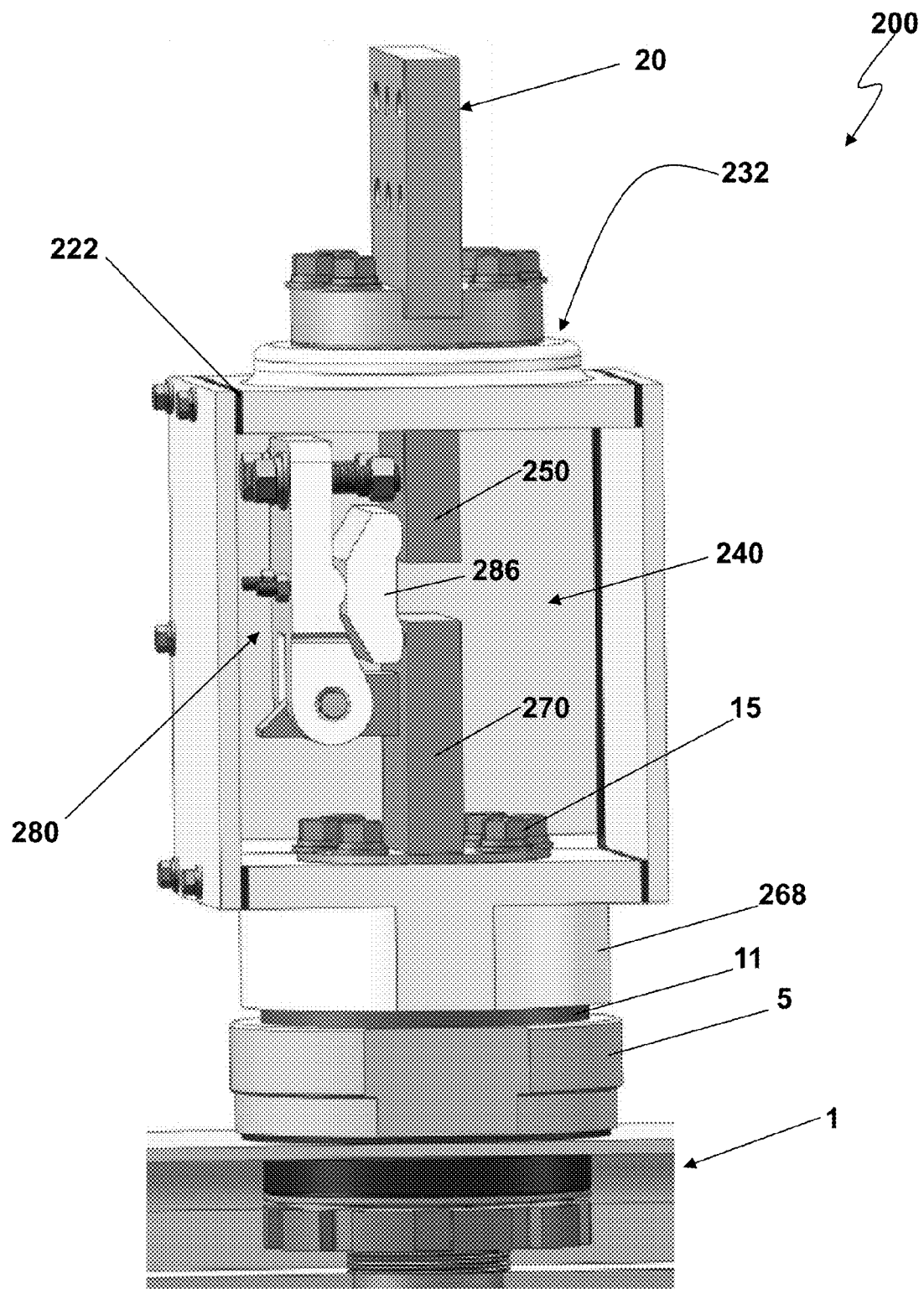
FIG. 9 is a perspective x-ray view of a single link disconnect box shown in FIGS. 7 and 8 in a closed position.
Figure 10:
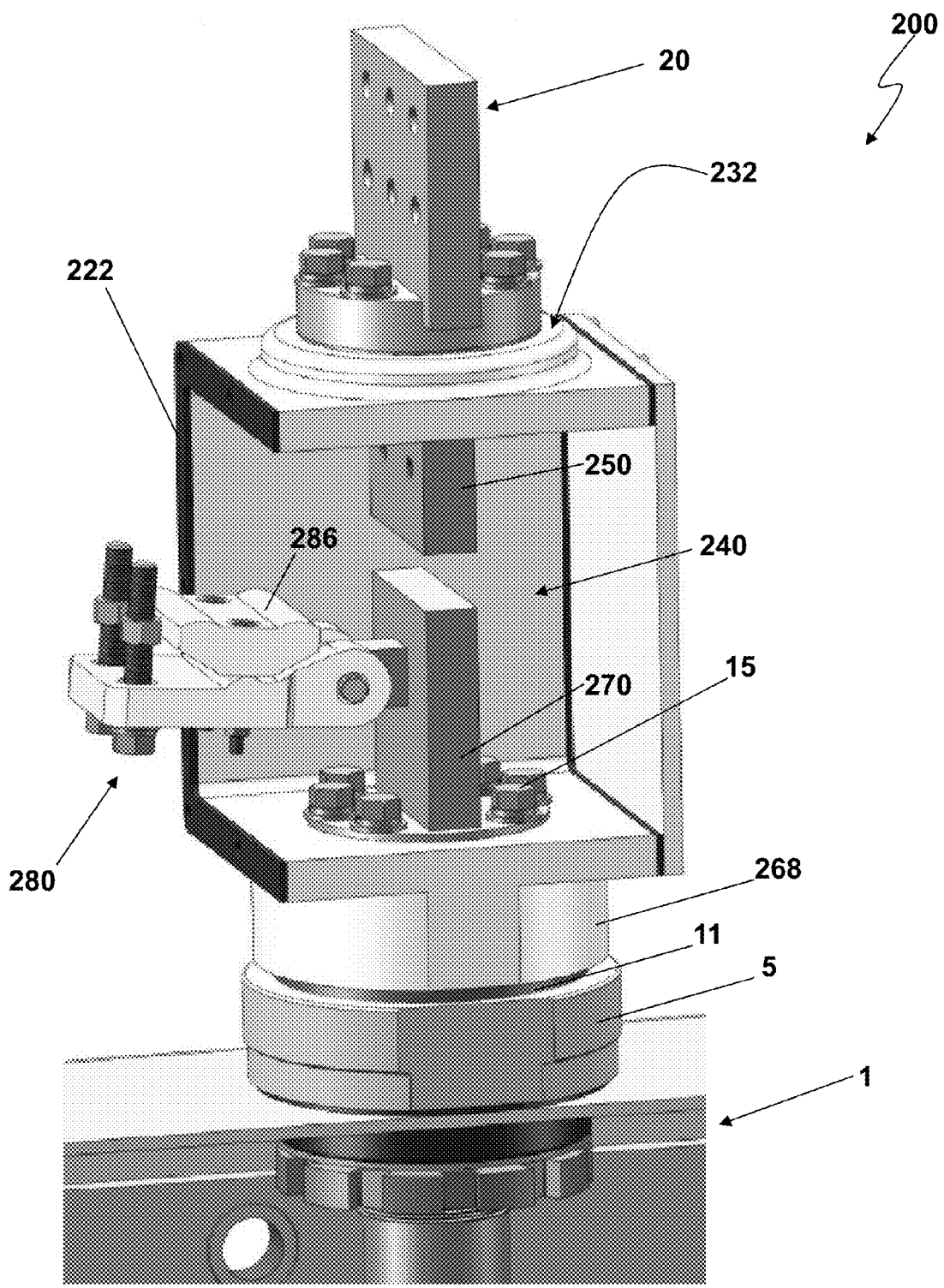
FIG. 10 is a perspective x-ray view of a single link disconnect box shown in FIGS. 7 and 8 in an open position.

FIGS. 9 and 10 present perspective views of link disconnect box 200 installed on network protector 1 while in the closed position and open position, respectively. While in the normal operating condition so that network protector 1 is energized and connected to the low voltage network, front face plate 220 is bolted and sealed against gasket 222 to ensure cavity 240 remains sealed against the ingress of both air and liquids. Link 280 is bolted in the closed position, so that bus bar bridge 286 electrically connects top bus bar 250 with bottom bus bar 270, and thus top terminal plate 232 with bottom terminal plate 262. A spade terminal 20 may be bolted to top terminal plate 232 to provide for the electrical connection of secondary power lines of the low voltage network. Hence, top terminal plate 232, as discussed above, is preferably formed as to mechanically correspond to spade terminal 20, and in some embodiments may have the same mechanical configuration as output terminal 5 of network protector 1—i.e., of top terminal plate 7.

To de-energize network protector 1 from the low voltage network, face plate 220 is removed to expose and gain access to cavity 240. An extended insulated wrench is used to unbolt link 280 from top bus bar 250, and link 280 subsequently falls into the open position, thus creating an air gap between bus bars 250 and 270 and thereby de-energizing network protector 1 from the low voltage network. A lineman may thereafter safely work on network protector 1 without concern of energy from the low voltage network. Further, because each link disconnect box 200 de-energizes its respective phase terminal 5, the lineman also does not need to worry about phase-to-phase arcing within network protector 1, thereby further ensuring the safety of the lineman when servicing network protector 1. Similar advantages are obtained by use of first embodiment link disconnect box 100, as well.

A potential drawback of the embodiment link disconnect box 200 is that securing bolts 15 require access to cavity 240, which may be inconvenient, particularly when working around bus bars 250 and 270. Also, through holes 264 through which bolts 15 pass to mechanically engage with network protector 1 may permit the unwanted ingress of air, liquids or both into cavity 240, despite the presence of O-ring 11.

Figure 11:
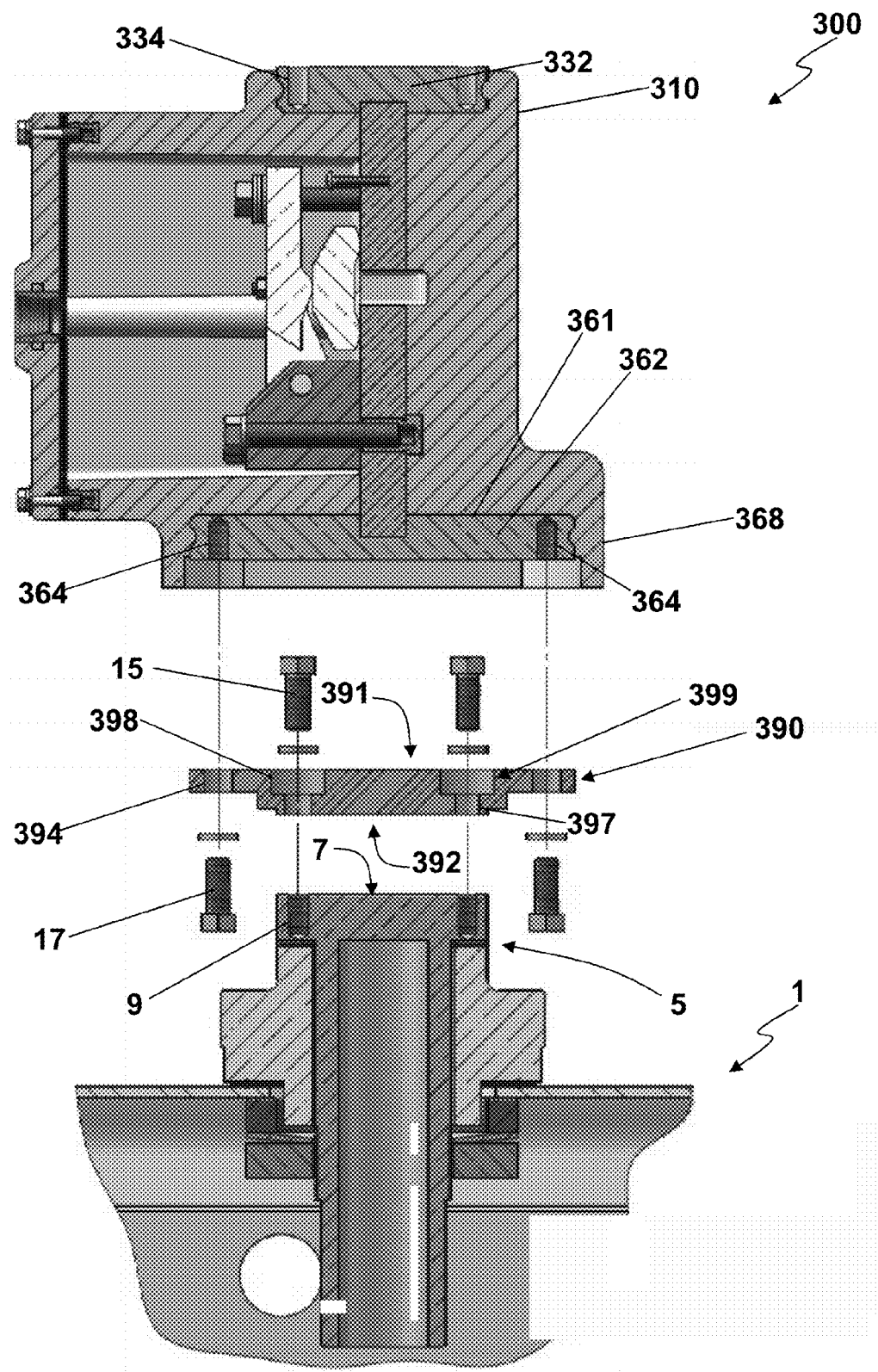
FIGS. 11 and 12 are cross-sectional views illustrating installation of another embodiment link disconnect box and a related adapter.
Figure 12:
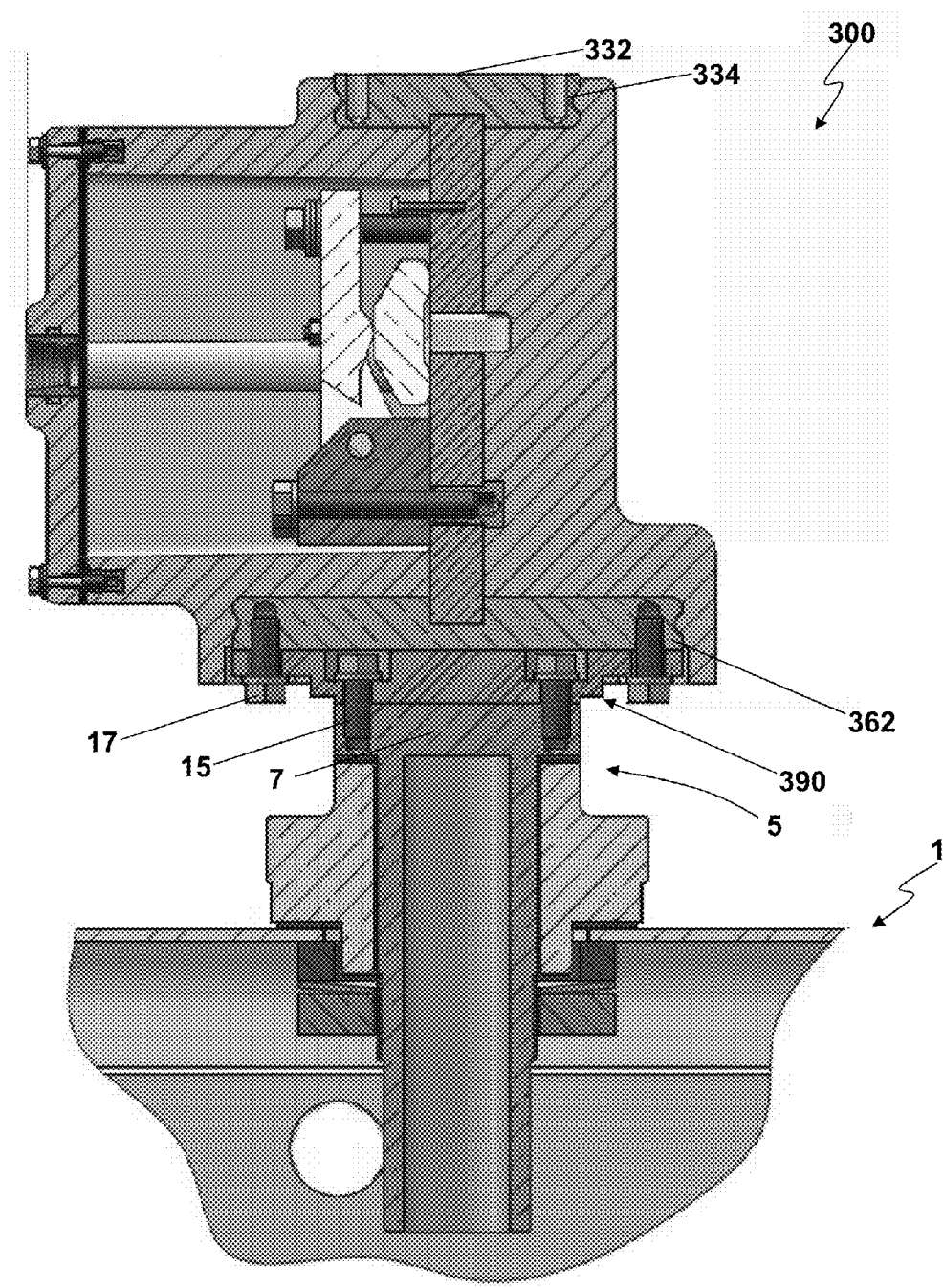

Embodiment 300 depicted in FIGS. 11 and 12 avoids these drawbacks by having a bottom terminal plate 362 that has no through holes, unlike bottom terminal plate 262 in the embodiment link disconnect box 200 discussed above. Also, embodiment link disconnect box 300 makes use of a terminal adapter plate 390 that permits link disconnect box 300 to be field installed onto the existing terminal of any network protector, regardless of make or model. It will be appreciated that suitable terminal adapter plates 390 may also be made for the embodiment link disconnect boxes 100, 200 or any other embodiment link disconnect box.

Link disconnect box 300 is substantially the same as first embodiment link disconnect box 100 and includes a lower protrusion 368 on the outer casing 310 that defines a recess 361 within which is disposed the bottom terminal plate 362. Bottom terminal plate 362 may include a recess, protrusion or the like around its outer periphery, as shown in FIGS. 11 and 12, to better ensure rigid coupling with the walls of recess 361. Bottom terminal plate 362 forms an air and liquid tight seal with lower protrusion 368 and includes a plurality of threaded holes 364 disposed in a predetermined pattern across the exterior surface of bottom terminal plate 362, for example in a pattern as discussed previously with respect to first embodiment link disconnect box 100. These threaded holes 364 do not pass all the way through bottom terminal plate 362 but extend upwards only partially into bottom terminal plate 362. Preferably, link disconnect box 300 is designed so that bottom terminal plate 362 spans a larger surface area than an output terminal 5 of a target network protector 1, or of most or even all known network protectors, and in particular is preferably designed so that threaded holes 364 delimit a greater surface area than that spanned by top terminal plate 7 of network protector 1.

Adapter plate 390 is designed to fit within recess 361 and engage with bottom terminal plate 362. Adapter plate 390 may be made from, for example, silver-plated copper and have a thickness of from ⅝ of an inch to 2 inches, preferably about 1 inch. Adapter plate 390 includes a first side 391 that is configured to abut immediately against bottom terminal plate 362, and includes through holes 394 (or other suitable connector type) that align with threaded holes 364 (or other suitable corresponding connector type) of bottom terminal plate 362. Bolts 17 (typically in conjunction with corresponding washers) may be passed through through holes 394 to threadedly engage with threaded holes 364 so as to securely mechanically and electrically connect adapter plate 390 to bottom terminal plate 362. Adapter plate 390 has a second side 392 that is configured to abut immediately against top terminal plate 7 of output terminal 5 of network protector 1, and includes through holes 399 that align with connectors on top terminal plate 7 that are on terminal 5 of network protector 1. Such connectors are typically threaded holes 9, although they may also include, by way of example, all-thread, bolts or the like. Hence, the shape of the first side 391 of adapter plate 390 preferably corresponds to the shape of bottom terminal plate 362 of link disconnect box 300, and has a pattern of through holes 394 that correspond with the pattern of threaded holes 364 in the bottom terminal plate 362. Similarly, the shape of the second side 392 of adapter plate 390 preferably corresponds to the shape of top terminal plate 7 of network protector 1, and has a pattern of through holes 399 that correspond with threaded holes 9 in the top terminal plate 7 of network protector 1. In preferred embodiments, the through holes 399 for the second surface 392 are configured so that bolts 15 may be completely disposed within the through holes 399 to extend from second side 392. As such, through holes 399 preferably include a larger-diameter portion 398 that descends from first side 391, and a smaller-diameter portion 397 that extends up from second side 392; larger-diameter portions 398 are slightly larger and deeper than the diameter and height, respectively, of the heads of bolts 15, while small-diameter portions 397 are smaller that the heads of bolts 15 but accept the shafts of bolts 15. Bolts 15 (typically in conjunction with corresponding washers) may be passed through holes 399 to threadedly engage with threaded holes 9 in top plate terminal 7 of network protector 1 so as to securely mechanically and electrically connect adapter plate 390 to top terminal plate 7.

To field install link disconnect box 300 onto an existing terminal 5 of network protector 1, a lineman selects the proper terminal adapter plate 390 that corresponds to output terminal 5 of network protector 1. The lineman removes the secondary power lines from existing output terminal 5, and then installs the appropriate adapter plate 390 onto this existing output terminal 5 by placing the second surface 392 against the top plate terminal 7, aligning the holes 9 and 399 with each other, and then passing bolts 15 (preferably with respective washers) through holes 399 to engage with threaded holes 9 of output terminal 5. There is no need to exchange the existing output terminal 5 of network protector 1 for a new or different output terminal. Bolts 15 are selected so that their heads rest entirely within larger-diameter holes 398 and thus do not protrude above second surface 392, and firmly mechanically and electrically connect adapter plate 390 to existing top terminal 9. Link disconnect box 300 is then lowered onto adapter plate 390 so that bottom terminal plate 362 aligns with top surface 391 of adapter plate 390. Because through holes 394 of adapter plate 390 extend outside output terminal 5 of network protector 1, bolts 17 (preferably in conjunction with washers) may be easily passed through through holes 394 to engage with threaded holes 364 in bottom plate terminal 362. Output terminal 5 of network protector 1 is thereby firmly mechanically and electrically connected to bottom plate terminal 362 of link disconnect box 300 via terminal adapter plate 390. Secondary power lines from the low voltage network may then be coupled to the top terminal plate 332 by, for example, coupling a spade terminal to top terminal plate 332 using threaded holes 334, and then coupling the secondary power lines to the spade terminal.

It will be appreciated that various types of terminal adapter plates 390 may be manufactured, each corresponding to a different make, model or both of network protector so that all makes and models of network protectors can be supported and used with any embodiment link disconnect box. Further, use of terminal adapter plates provides for more flexibility in the design of bottom terminal plates in the link disconnect boxes, so that a proprietary pattern or design may be used for the bottom terminal plates of the link disconnect boxes, yet these link disconnect boxes can still be easily and readily retrofitted and field installed onto the existing terminals of network protectors.

Figure 13:
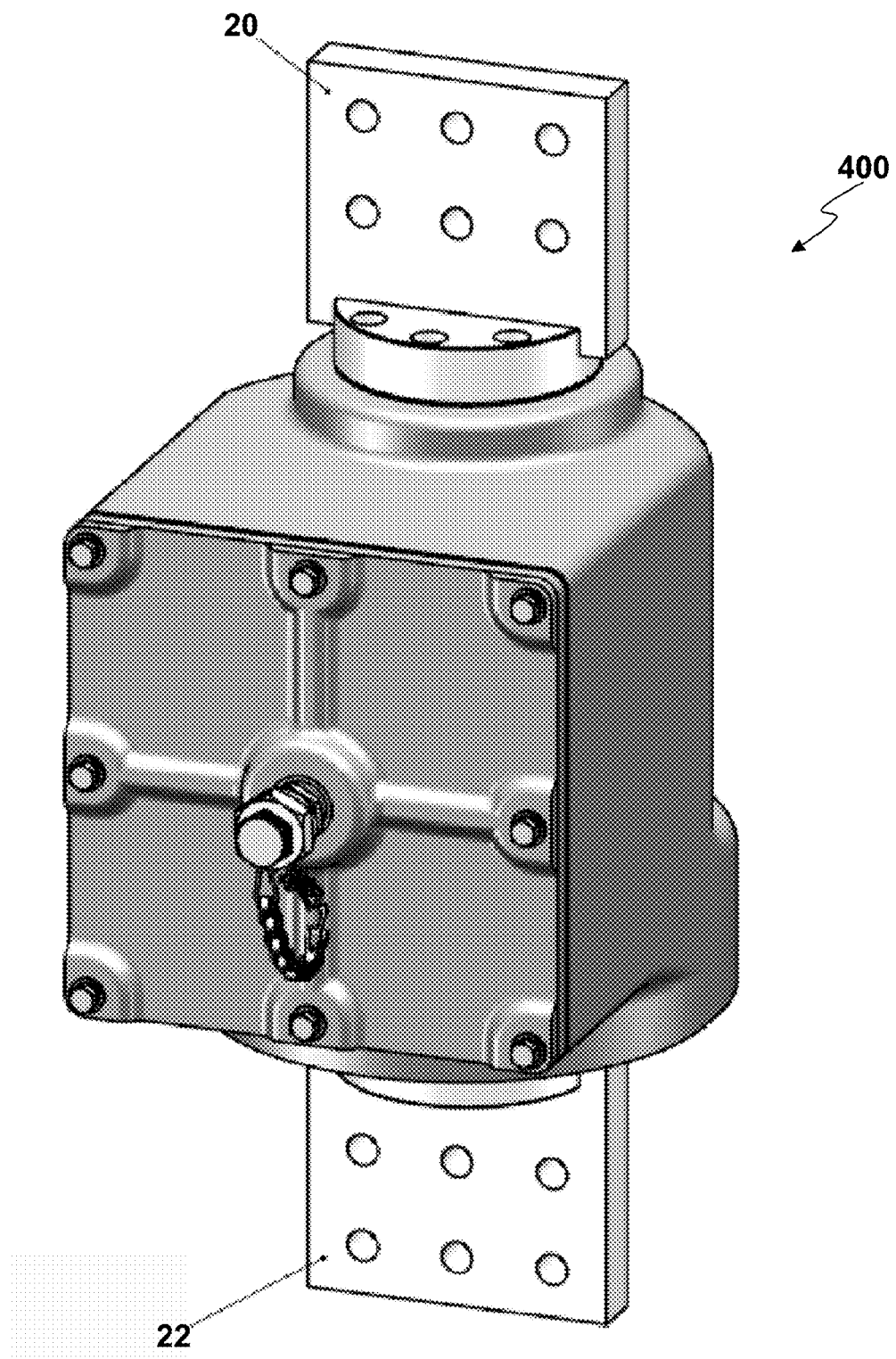
FIG. 13 is a perspective view of another embodiment link disconnect box.

Not all network protectors include a relatively flat, horizontal surface for the output terminal. Some, for example, may have a spade-type terminal for an existing output terminal. In such situations, it may be desirable to employ a spade-to-spade connection to electrically connect an embodiment link disconnect box to such a network protector. An embodiment link disconnect box 400 is depicted in FIG. 13 for such a connection, and includes a bottom spade terminal 22 and a top spade terminal 20. Top spade terminal 20 may be used for connection to the secondary power lines of the low voltage network, while bottom spade terminal 22 may be used to mechanically and electrically connect to the existing spade terminal on the output port of a network protector. A suitably designed adapter plate may be used, for example, to connect bottom spade terminal 22 to the bottom plate terminal of link disconnect box 400. Alternatively, the bottom plate terminal of link disconnect box 400 may be shaped in the form of a spade terminal or a standard spade terminal may be bolted to the bottom terminal plate.

Figure 14:
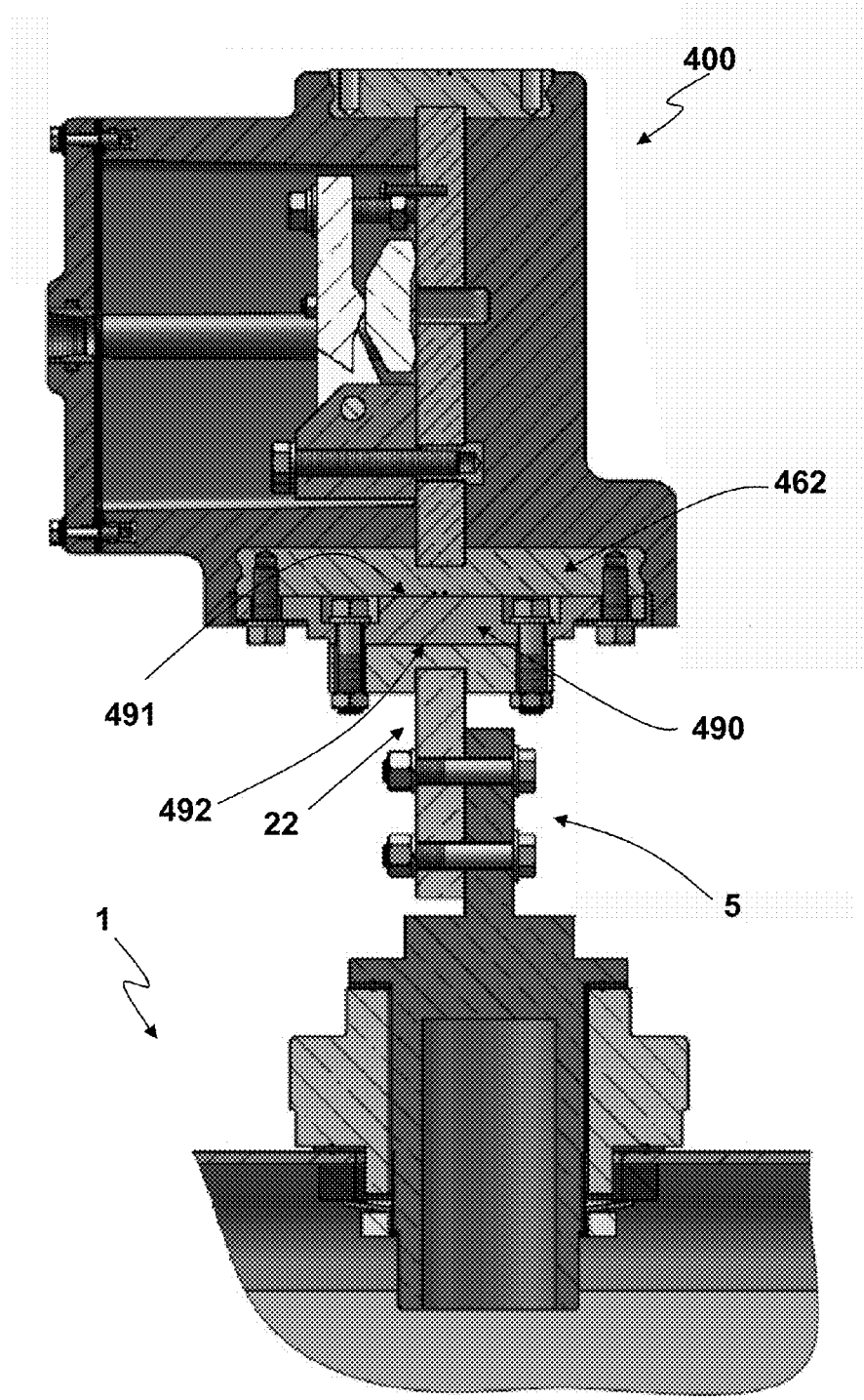
FIG. 14 illustrates a spade-to-spade connection between a link disconnect box and an existing terminal of a network protector according to an embodiment of the invention.

FIG. 14 is a cross-sectional view, illustrating the link disconnect box 400 being installed onto an existing output spade terminal 5 of network protector 1. An adapter plate 490 can be used, which is bolted to the bottom terminal plate 462 of link disconnect box 400. The adapter plate 490 has a first surface 491 shaped to mate with bottom terminal plate 462 of link disconnect box 400, and a second surface 492 shaped to mate with a bottom face of spade terminal 22, which may have a conventional shape. The top face of spade terminal 22 is used to electrically and mechanically connect to the output spade terminal 5 of network protector 1, in which the faces of the spade terminals 22, 5 are bolted to each other, thereby mechanically and electrically connecting link disconnect box 400 to network protector 1.

Figure 15:
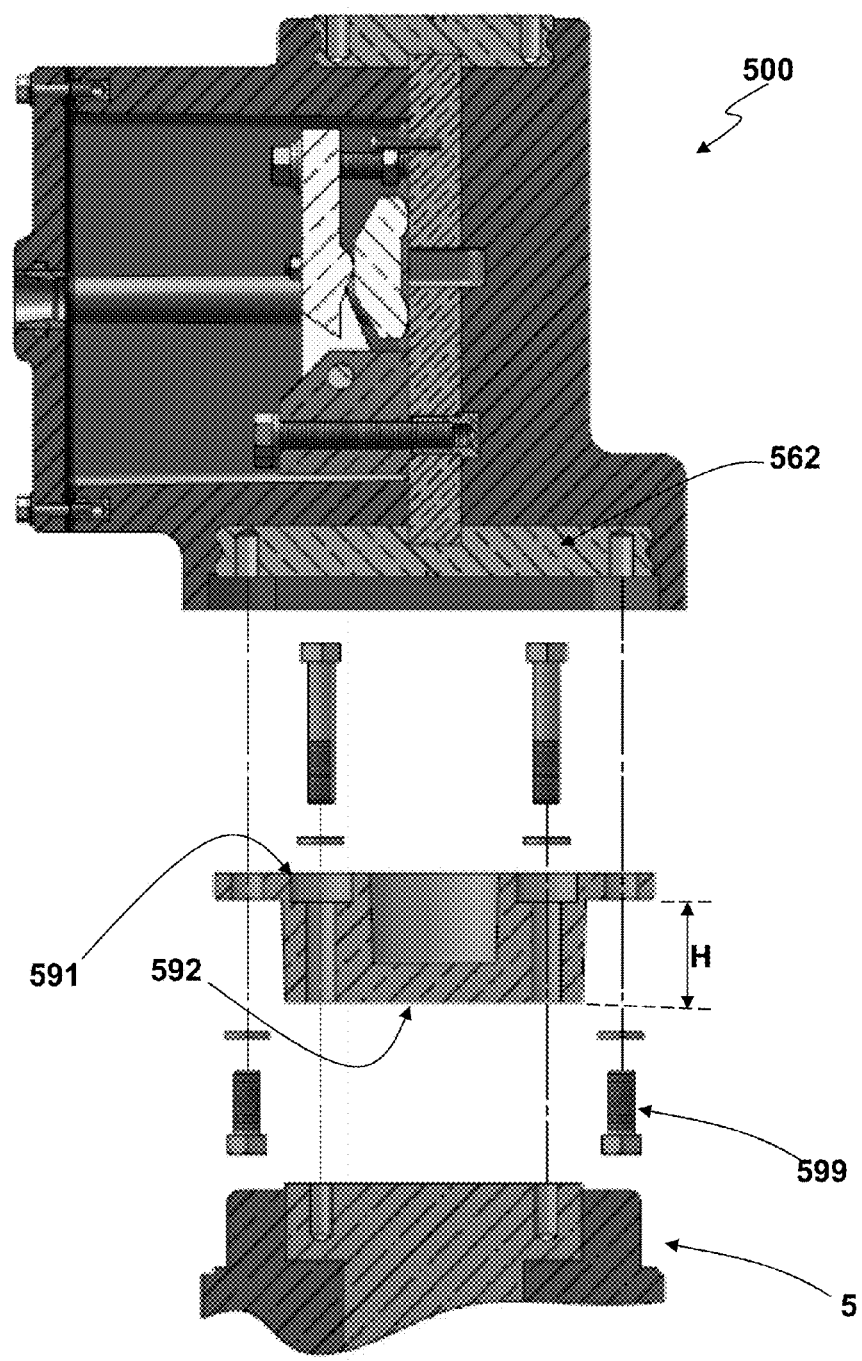
FIGS. 15 and 16 illustrate a standoff adapter for a link disconnect box according to an embodiment of the invention.
Figure 16:
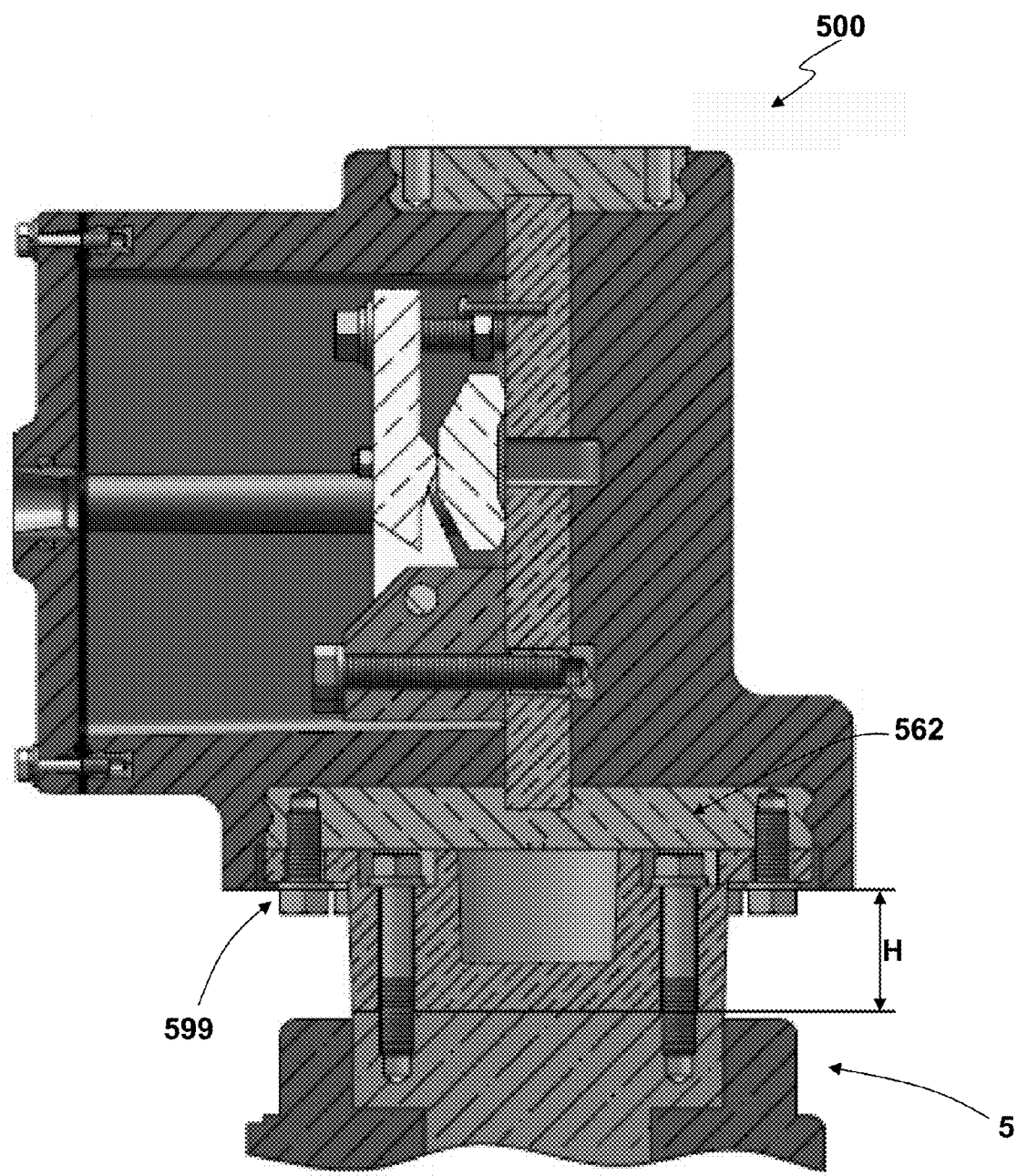

For some network protectors, the existing terminal 5 and its related surrounding insulation are flush with respect to each other and the surrounding areas of the network protector, as shown in FIG. 15. To permit a lineman sufficient access to existing terminal 5 while connecting a link disconnect box 500, a standoff adapter plate 590 may be used. Standoff adapter plate 590 has a relatively tall profile, which, as shown in FIG. 16, provides adequate room for a lineman to install mounting bolts 599 when connecting the link disconnect box 500 to existing terminal 5 of the network protector. Preferably, the standoff height H of adapter plate 590 exceeds the length of mounting bolts 599 so that mounting bolts 599 may be easily inserted between existing terminal 5 of the network protector and the first face 591 that bolts onto bottom terminal plate 562 of link disconnect box 500. The standoff height H may be measured, for example, from the bottom surface of first surface 591 that contacts bottom terminal plate 562 and second surface 592 that contacts the existing terminal 5 of the network protector. Preferably, the standoff height H is greater that 1 inch, more preferably still between 2.5 and 2.5 inches, more preferably still from 1.75 to 2.0 inches.

Those skilled in the art will recognize that the present invention has many applications, may be implemented in various manners and, as such is not to be limited by the foregoing embodiments and examples. Any number of the features of the different embodiments described herein may be combined into a single embodiment, the locations of particular elements can be altered and alternate embodiments having fewer than or more than all of the features herein described are possible. Functionality may also be, in whole or in part, distributed among multiple components, in manners now known or to become known.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention. While there has been shown and described fundamental features of the invention as applied to being exemplary embodiments thereof, it will be understood that omissions and substitutions and changes in the form and details of the disclosed invention may be made by those skilled in the art without departing from the spirit of the invention. Moreover, the scope of the present invention covers conventionally known, future developed variations and modifications to the components described herein as would be understood by those skilled in the art.

What is claimed is:

1. A link disconnect box for a voltage distribution network, the link disconnect box comprising:
   an outer casing defining a cavity, a front face opening, a top bus bar opening, and a bottom bus bar opening;
   a top terminal disposed over the top bus bar opening, the top terminal comprising a top plate surface with at least a connection point for mechanically connecting to one or more corresponding connection points in the voltage distribution network;
   a bottom terminal disposed over the bottom bus bar opening, the bottom terminal comprising a bottom plate surface with at least a connection point for mechanically connecting to an existing terminal of a network protector in the voltage distribution network;
   a top bus bar electrically coupled to the top terminal and extending through the top bus bar opening;
   a bottom bus bar electrically coupled to the bottom terminal and extending through the bottom bus bar opening, wherein an air gap electrically isolates the top bus bar from the bottom bus bar within the cavity; and
   an electrical link configured to electrically connect and disconnect the top bus bar and the bottom bus bar by electrically bridging the air gap.

2. The link disconnect box of claim 1 further comprising a face plate for removably covering the front face opening, wherein the face plate sealingly covers the front face opening, the top terminal sealingly covers the top bus bar opening, and the bottom terminal sealingly covers the bottom bus bar opening.

3. The link disconnect box of claim 2 wherein the face plate further comprises an air pressurization port for pressurizing the cavity.

4. The link disconnect box of claim 1 wherein the bottom terminal comprises through holes configured to align with connectors in the existing terminal of the network protector.

5. The link disconnect box of claim 1 wherein the at least a connection point of the bottom terminal comprises a threaded opening that does not pass through the bottom terminal.

6. The link disconnect box of claim 1 wherein the bottom plate surface covers the bottom bus bar opening and is connected to the bottom bus bar, and a terminal adapter plate is removably connected to the bottom plate surface, the terminal adapter plate comprising a first surface configured to mechanically and electrically engage with the at least a connection point of the bottom plate surface, and a second surface configured to mechanically and electrically engage with the existing terminal of the network protector.

7. The link disconnect box of claim 6 wherein the bottom plate surface has a larger surface area than the existing terminal of the network protector.

8. The link disconnect box of claim 7 wherein the terminal adapter plate comprises first through holes for coupling the terminal adapter plate to the at least a connection point of the bottom plate surface, and second through holes for coupling the terminal adapter plate to the existing terminal of the network protector, wherein the first through holes delimit a greater surface area than a surface area delimited by the second through holes.

9. The link disconnect box of claim 8 wherein openings of the first through holes in the first surface have respective diameters that are greater than openings of the first through holes in the second surface.

10. The link disconnect box of claim 8 wherein the at least a connection point of the bottom plate surface comprises threaded openings that do not pass through the bottom plate surface, and the first through holes align with the threaded openings.

11. The link disconnect box of claim 6 wherein the at least a connection point of the bottom plate surface comprises threaded openings that do not pass through the bottom terminal plate, and the terminal adapter plate comprises first through holes aligned with the threaded openings for coupling the terminal adapter plate to the bottom plate surface.

12. The link disconnect box of claim 1 wherein the electrical link is further configured to be mechanically secured in a closed position in which the air gap is bridged, and is further configured to fall under gravity into an open position in which the air gap is not bridged when not mechanically secured in the closed position.

13. The link disconnect box of claim 12 wherein the electrical link comprises a swing arm for bridging the air gap, the swing arm comprising at least an opening, and wherein the upper bus bar comprises at least a threaded hole corresponding to the at least an opening in the swing arm, and a bolt disposed through the opening in the swing arm and engaged with the threaded hole in the upper bus bar to mechanically secure the link in the closed position.

14. The link disconnect box of claim 1 wherein the top terminal has a mechanical configuration corresponding to the existing terminal of the network protector.

15. The link disconnect box of claim 1 wherein the bottom terminal is a spade terminal.

16. The link disconnect box of claim 1 wherein the top terminal is a spade terminal.

17. A method for field retrofitting of a network protector in a voltage distribution network, the method comprising:
removing at least a secondary power line from an existing output terminal of the network protector;
electrically and mechanically coupling a link disconnect box to the existing terminal of the network protector; and
electrically and mechanically coupling the at least a secondary power line to the link disconnect box;
wherein the link disconnect box comprises:
an outer casing defining a cavity, a top bus bar opening, and a bottom bus bar opening;
a top terminal disposed over the top bus bar opening, the top terminal configured to mechanically and electrically couple to the at least a secondary power line;
a bottom terminal disposed over the bottom bus bar opening and configured to electrically and mechanically connect to the existing terminal of the network protector;
a top bus bar electrically coupled to the top terminal and extending through the top bus bar opening;
a bottom bus bar electrically coupled to the bottom terminal and extending through the bottom bus bar opening, wherein an air gap electrically isolates the top bus bar from the bottom bus bar within the cavity; and
an electrical link configured to electrically connect and disconnect the top bus bar and the bottom bus bar by electrically bridging the air gap.

18. The method of claim 17 further comprising:
connecting a spade terminal to the top terminal; and
electrically and mechanically connecting the at least a secondary power line to the spade terminal.

19. The method of claim 17 wherein the bottom terminal comprises a first spade terminal, the existing terminal of the network protector comprises a second spade terminal, and the method comprises connecting the first spade terminal to the second spade terminal.

20. The link disconnect box of claim 1 wherein the electrical link is fixed to and directly contacts one or more of the bottom bus bar and the outer casing.

21. The link disconnect box of claim 20 wherein the electrical link is releasably connected to and directly contacts the top bus bar.

22. The link disconnect box of claim 20 wherein the electrical link is bolted to the bottom bus bar.

23. A link disconnect box for a voltage distribution network, the link disconnect box comprising:
an outer casing defining a cavity, a top bus bar opening, and a bottom bus bar opening;
a top terminal disposed over the top bus bar opening;
a bottom terminal disposed over the bottom bus bar opening and configured to electrically and mechanically connect to an existing terminal of a network protector in the voltage distribution network;
a top bus bar electrically coupled to the top terminal and extending through the top bus bar opening;
a bottom bus bar electrically coupled to the bottom terminal and extending through the bottom bus bar opening, wherein an air gap electrically isolates the top bus bar from the bottom bus bar within the cavity; and
an electrical link configured to electrically connect and disconnect the top bus bar and the bottom bus bar by electrically bridging the air gap;
wherein the bottom terminal comprises a bottom terminal plate covering the bottom bus bar opening and connected to the bottom bus bar, and a terminal adapter plate removably connected to the bottom terminal plate, the terminal adapter plate comprising a first surface configured to mechanically and electrically engage with the bottom plate terminal, and a second surface configured to mechanically and electrically engage with the existing terminal of the network protector.

24. The link disconnect box of claim 23 wherein the outer casing further defines a front face opening, and the link disconnect box further includes a face plate for removably and sealingly covering the front face opening, the top terminal sealingly covers the top bus bar opening, the bottom terminal sealingly covers the bottom bus bar opening, and the electrical link is fixed to a surface within the cavity opposite the front face opening.

25. The link disconnect box of claim 23 wherein the bottom terminal plate comprises threaded openings that do not pass through the bottom terminal plate, and the terminal adapter plate comprises first through holes aligned with the threaded openings for coupling the terminal adapter plate to the bottom terminal plate.

26. The link disconnect box of claim 23 wherein the electrical link comprises a swing arm for bridging the air gap, the swing arm comprising at least an opening, and wherein the upper bus bar comprises at least a threaded hole corresponding to the at least an opening in the swing arm, and a bolt is disposed through the opening in the swing arm and engaged with the threaded hole in the upper bus bar to mechanically secure the link in the closed position, wherein the swing arm is configured to fall under gravity into an open position in which the air gap is not bridged when not mechanically secured in the closed position.

27. The link disconnect box of claim 23 wherein the electrical link is fixed to and directly contacts one or more of the bottom bus bar and the outer casing.

28. A link disconnect box for a voltage distribution network, the link disconnect box comprising:
an outer casing defining a cavity, a top bus bar opening, and a bottom bus bar opening;
a top terminal disposed over the top bus bar opening;
a bottom terminal disposed over the bottom bus bar opening and configured to electrically and mechanically connect to an existing terminal of a network protector in the voltage distribution network;
a top bus bar electrically coupled to the top terminal and extending through the top bus bar opening;
a bottom bus bar electrically coupled to the bottom terminal and extending through the bottom bus bar opening, wherein an air gap electrically isolates the top bus bar from the bottom bus bar within the cavity; and
an electrical link configured to electrically connect and disconnect the top bus bar and the bottom bus bar by electrically bridging the air gap, the electrical link configured to be mechanically secured in a closed position in which the air gap is bridged, and to fall under gravity into an open position in which the air gap is not bridged when not mechanically secured in the closed position;
wherein the electrical link comprises a swing arm for bridging the air gap, the swing arm comprising at least an opening, and wherein the upper bus bar comprises at least a threaded hole corresponding to the at least an opening in the swing arm, and a bolt disposed through the opening in the swing arm engages with the threaded hole in the upper bus bar to mechanically secure the link in the closed position.

29. The link disconnect box of claim 28 wherein the outer casing further defines a front face opening, and the link disconnect box further includes a face plate for removably and sealingly covering the front face opening, the top terminal sealingly covers the top bus bar opening, the bottom terminal sealingly covers the bottom bus bar opening, and the electrical link is fixed to a surface within the cavity opposite the front face opening.

30. The link disconnect box of claim 28 wherein the bottom terminal comprises a bottom terminal plate covering the bottom bus bar opening and connected to the bottom bus bar, and a terminal adapter plate removably connected to the bottom terminal plate, the terminal adapter plate comprising a first surface configured to mechanically and electrically engage with the bottom plate terminal, and a second surface configured to mechanically and electrically engage with the existing terminal of the network protector.

31. The link disconnect box of claim 30 wherein the bottom terminal plate comprises threaded openings that do not pass through the bottom terminal plate, and the terminal adapter plate comprises first through holes aligned with the threaded openings for coupling the terminal adapter plate to the bottom terminal plate.

32. The link disconnect box of claim 28 wherein the electrical link is fixed to and directly contacts one or more of the bottom bus bar and the outer casing.

* * * * *

UNITED STATES PATENT AND TRADEMARK OFFICE
CERTIFICATE OF CORRECTION

PATENT NO.          : 9,006,595 B2                              Page 1 of 1
APPLICATION NO.     : 13/750603
DATED               : April 14, 2015
INVENTOR(S)         : Douglas Robert Craig It is certified that error appears in the above-identified patent and that said Letters Patent is hereby corrected as shown below:

On the title page change
Item "(73)     Assignee: Richards Manufacturing Company, Irvington, NJ (US)"
to
--(73)         Assignee: Richards Manufacturing Company, a New Jersey Limited Partnership, Irvington, NJ (US)--.

Signed and Sealed this
Fourth Day of August, 2015

Michelle K. Lee
*Director of the United States Patent and Trademark Office*